United States Patent
Kim et al.

(10) Patent No.: US 7,038,777 B2
(45) Date of Patent: May 2, 2006

(54) SEMICONDUCTOR WAFER BEARING ALIGNMENT MARK FOR USE IN ALIGNING THE WAFER WITH EXPOSURE EQUIPMENT, ALIGNMENT SYSTEM FOR PRODUCING ALIGNMENT SIGNALS FROM THE ALIGNMENT MARK, AND METHOD OF DETERMINING THE ALIGNED STATE OF A WAFER FROM THE ALIGNMENT MARK

(75) Inventors: Young-chang Kim, Seoul (KR);
Heung-jo Ryuk, Yongin (KR);
Young-koog Han, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 482 days.

(21) Appl. No.: 10/290,282

(22) Filed: Nov. 8, 2002

(65) Prior Publication Data

US 2003/0053060 A1 Mar. 20, 2003

Related U.S. Application Data

(62) Division of application No. 09/472,014, filed on Dec. 27, 1999, now Pat. No. 6,501,189.

(30) Foreign Application Priority Data

Dec. 30, 1998 (KR) .................................. 98-60970
May 25, 1999 (KR) .................................. 99-18859

(51) Int. Cl.
*G01B 11/00* (2006.01)
*H01L 23/544* (2006.01)
(52) U.S. Cl. .................... 356/401; 356/399; 355/53
(58) Field of Classification Search ........ 356/399–401; 355/53; 257/797; 438/401
See application file for complete search history.

(56) References Cited

U.S. PATENT DOCUMENTS 4,655,598 A 4/1987 Murakami et al.

(Continued)

*Primary Examiner*—Layla G. Lauchman
(74) *Attorney, Agent, or Firm*—Volentine Francos & Whitt, PLLC

(57) ABSTRACT

A semiconductor wafer has an alignment mark for use in aligning the wafer with exposure equipment during the manufacturing of a semiconductor device. The wafer is made by forming a chemical mechanical polishing target layer over an alignment mark layer, chemically-mechanically polishing the target layer to planarize the same, and prior to forming the chemical mechanical polishing target layer over the alignment mark layer, forming a dense pattern of lands or trenches in the alignment layer of dimensions and an inter-spacing preselected to inhibit a dishing phenomenon from occurring in the target layer as the result of its being chemically-mechanically polished. The lands or trenches may be disposed in at least a 2×2 array of rows and columns. An alignment system for use with this wafer irradiates the mark with light, and includes an image sensor which produces both a Y-axis alignment waveform signal from light reflecting from the column(s) of lands or trenches and an X-axis alignment waveform signal from light reflecting from the row(s) of lands or trenches. Alternatively, the lands or trenches may be disposed along at least two lines arranged in the shape of a chevron. In this case, the alignment system scans an illuminated cross-shaped pattern of a reticle across the alignment mark. A photo-detection unit collects the reflected light and determines the relative amounts of light coming from the wafer surface, from one of the lines of lands or trenches of the alignment mark, and from the other such line of lands or trenches.

2 Claims, 19 Drawing Sheets

U.S. PATENT DOCUMENTS

| | | |
|---|---|---|
| 4,702,606 A | 10/1987 | Matsuura et al. |
| 5,106,432 A | 4/1992 | Matsumoto et al. |
| 5,801,090 A | 9/1998 | Wu et al. |
| 5,827,629 A | 10/1998 | Miyatake |
| 5,907,405 A * | 5/1999 | Mizutani et al. ............ 356/399 |
| 5,926,720 A | 7/1999 | Zhao et al. |
| 5,933,744 A | 8/1999 | Chen et al. |
| 5,963,816 A | 10/1999 | Wang et al. |
| 6,010,945 A | 1/2000 | Wu |
| 6,030,880 A | 2/2000 | Coutts |
| 6,037,236 A | 3/2000 | Jang |
| 6,043,133 A | 3/2000 | Jang et al. |
| 6,049,137 A | 4/2000 | Jang et al. |
| 6,100,157 A | 8/2000 | Ohtaka |
| 6,114,072 A | 9/2000 | Narimatsu |
| 6,114,215 A | 9/2000 | Osugi et al. |
| 6,184,104 B1 | 2/2001 | Tan et al. |
| 6,207,966 B1 | 3/2001 | Nguyen et al. |
| 6,232,200 B1 | 5/2001 | Chu |
| 6,232,231 B1 | 5/2001 | Sethuraman et al. |
| 6,239,031 B1 | 5/2001 | Kepler et al. |
| 6,239,499 B1 | 5/2001 | Zhao et al. |
| 6,278,957 B1 | 8/2001 | Yasuda et al. |
| 6,284,560 B1 | 9/2001 | Jech, Jr. et al. |
| 6,313,542 B1 | 11/2001 | Pramanik et al. |
| 6,654,097 B1 * | 11/2003 | Nishi .......................... 355/53 |

* cited by examiner

SEMICONDUCTOR WAFER BEARING ALIGNMENT MARK FOR USE IN ALIGNING THE WAFER WITH EXPOSURE EQUIPMENT, ALIGNMENT SYSTEM FOR PRODUCING ALIGNMENT SIGNALS FROM THE ALIGNMENT MARK, AND METHOD OF DETERMINING THE ALIGNED STATE OF A WAFER FROM THE ALIGNMENT MARK

CROSS REFERENCE TO RELATED APPLICATIONS

This is a divisional of application Ser. No. 09/472,014, filed Dec. 27, 1999 now U.S. Pat. No. 6,501,189, which is incorporated herein by reference in its entirety.

BACKGROUND OF THE INVENTION

1. Field of the Invention

The present invention relates to a photolithographic process for manufacturing semiconductor devices. More particularly, the present invention relates to a wafer bearing an alignment mark used to align the wafer with photolithographic exposure equipment, to the manner in such a wafer is produced, to the alignment system which examines the mark to produce the signals used to align the exposure equipment and the wafer, and to the method of aligning the exposure equipment and the wafer.

2. Description of the Related Art

Semiconductor devices typically comprise various circuit patterns stacked on a wafer. The circuit patterns are formed using a photolithographic process. Each circuit pattern formed must be aligned accurately with the circuit pattern which has been formed previously on the wafer. The alignment is achieved by illuminating a predetermined region of the wafer having an alignment mark formed thereon, and using the illuminated region to obtain photoelectric signals indicative of whether the exposure equipment of the photo processing system is properly aligned with the wafer. Typical alignment marks are shown in FIGS. 1 and 2.

The alignment mark shown in FIG. 1 comprises a series of parallel lines. The alignment mark is for use with an off-axis type field image alignment system having a halogen lamp as its source of illumination. The length I of, the width w1 of and the distance s between the lines 10 of the alignment mark are approximately 30 µm, 6 µm and 6 µm, respectively.

The alignment mark shown in FIG. 2 comprises a line 20 having a positive slope with respect to an X-Y coordinate system and a line 25 having a negative slope with respect to the X-Y coordinate system. The height h and the width w2 of the lines 20 and 25 are 82 µm and 1.5 µm, respectively.

Now, the wafer on which the alignment mark has been formed has undergone the various processes for forming previous circuit patterns thereon. These processes affect the integrity of the alignment mark. For instance, a chemical mechanical polishing (CMP) process affects the alignment mark to such an extent that the alignment signals derived therefrom are distorted. CMP is widely used for forming a trench isolation region, planarizing an inter-dielectric layer, forming a plug or forming a damascene interconnection in a semiconductor device to secure a high degree of integration for the device.

FIG. 3 is a sectional view of one of the lines of the alignment marks of FIGS. 1 and 2, as taken along lines III–III'. A layer 5 having a pattern of lines 10 (20) is formed on a wafer 1, and a layer 30 to be subjected to the CMP process is formed on the layer 5. When the structure shown in FIG. 3 undergoes the CMP process, a dishing phenomenon occurs in the layer 30' which is left by the CMP process, as shown in FIG. 4. This is because the alignment marks are composed of lines which are larger (30×6 µm²) than those making up the line pattern of the semiconductor device, and the line density of the pattern of the alignment mark is very low. The amount of material to be removed by the CMP process is set on the basis of the circuit pattern having a relatively high line density. As the CMP process produces a severe dishing phenomenon in the layer 30', it is also damaging the pattern of lines 10 (20) of the alignment mark.

The abrasion of the pattern of lines in association with the dishing phenomenon is a root cause of the production of distorted photoelectric signals during the alignment process. Distorted alignment signals in turn limit the degree to which the circuit patterns can be precisely aligned.

SUMMARY OF THE INVENTION

It is therefore one object of the present invention to provide an alignment mark which will not be damaged by CMP and thus is capable of being used to produce alignment signals facilitating a precise alignment of the wafer with the exposure equipment.

To achieve this object, the present invention provides a wafer bearing an alignment mark constituted by a plurality of lands or trenches (surface features) formed in a layer underlying a target layer planarized by chemical mechanical polishing, wherein the lands or trenches are arranged as densely as possible such that no dishing occurs in the target layer as the result of the chemical mechanical polishing process.

The spaced apart lands or trenches may be disposed in a 2×2 or larger array.

Alternatively, some of the lands or trenches may be disposed along at least one first line having a positive slope with respect to a reference X-Y coordinate system while the other lands or trenches are disposed along a second line having a negative slope with respect to the reference X-Y coordinate system, the lines being arranged in the shape of a chevron.

It is another object of the present invention to provide an alignment system which produces alignment signals, which can be used to precisely align a wafer with exposure equipment, from an alignment mark on the wafer constituted by spaced apart lands or trenches disposed in a 2×2 or larger array (rows and columns).

To achieve the second object, the present invention provides an alignment system comprising a source of illumination, a light transmitting unit for irradiating a field of a wafer bearing the alignment mark with light emitted from the illumination source and transmitting the light reflecting from the field, and a light collecting unit for collecting the reflected light transmitted thereto by the light transmitting unit, wherein the light collecting unit produces and displays a Y-axis alignment waveform signal indicative of characteristics of the light reflected from the columns of lands or trenches of the alignment mark and an X-axis alignment waveform signal indicative of characteristics of the light reflected form the rows of lands or trenches of the alignment mark.

It is another object of the present invention to provide an alignment system which produces alignment signals, which can be used to precisely align a wafer with exposure equipment, from an alignment mark on the wafer constituted by spaced apart lands or trenches disposed in the shape of a chevron.

To achieve this object, the present invention provides a scanning type of alignment system comprising an illumination source, an alignment sensor head for irradiating a field of a wafer bearing the alignment mark with light emitted from the illumination source and transmitting the light reflecting from the field, and an alignment detection unit for collecting the reflected light transmitted thereto by the light transmitting unit, wherein the alignment sensor head includes a reticle having a pattern in the shape of a cross, and the alignment detection unit includes a first detector section, a second detector section and a third detector section. One of the crossing lines of the pattern of the reticle has the same positive slope as that of one of the lines along which the lands or trenches of the alignment mark are disposed (the plus pattern), and the other of the crossing lines of the reticle has the same negative slope as the line along which the others of the lands or trenches of the alignment mark are disposed (the minus pattern). The pattern of the reticle is scanned across the alignment mark, whereby superimposed images of the reticle pattern and alignment mark are transmitted to the alignment detection unit. The first detector section receives an image comprising light reflecting perpendicular to the wafer surface. The second detector section receives an image comprising light scattered by the plus pattern of the alignment mark. The third detector section receives an image comprising light scattered by the minus pattern of the alignment mark. The three detector sections can be formed by a plurality of light detectors also arranged in the pattern of a cross.

It is still another object of the present invention to provide a method by which the degree of mis-alignment between a semiconductor wafer and exposure equipment can be accurately determined.

To achieve the third object, the present invention provides a method of examining a wafer having alignment marks each formed by at least a 2×2 array of lands or trenches of an alignment layer, and a photosensitive layer defining a plurality of exposure fields to which the alignment marks are dedicated. An alignment mark dedicated to a first selected exposure field is irradiated with light beams of a broadband of wavelengths selected to prevent interference between light beams reflecting from the photosensitive layer and light beams reflecting from the surface features of the wafer, and to prevent the photosensitive layer from being sensitized. Next, the light beams reflecting from the alignment mark are converted to an analog Y-axis photoelectric waveform signal (representing light reflecting from the rows of surface features of the alignment mark) and an analog X-axis photoelectric waveform signal (representing light reflecting from the columns of surface features of the alignment mark). Then, the analog photoelectric signals are digitized, and a deviation $\Delta x$ between the center of the X-axis signal and a signal representing an X-axis reference mark center and a deviation $\Delta y$ between the center of the Y-axis signal and a signal representing a Y-axis reference mark center are calculated. After that, the steps are repeated with respect to any other alignment mark dedicated to the selected exposure field. Then, the above steps are repeated with respect to the other exposure fields one exposure field at a time. Finally, the degree to which the wafer is misaligned with the exposure equipment is determined from a plurality of the deviations $\Delta x$ and $\Delta y$, and the wafer is aligned with the exposure equipment on the basis of the determination.

BRIEF DESCRIPTION OF THE DRAWINGS

The above and other objects, features and advantages of the present invention will become more apparent by referring to the following detailed description of preferred embodiments thereof made with reference to the attached drawings of which.

DETAILED DESCRIPTION OF THE PREFERRED EMBODIMENTS

Figure 1:
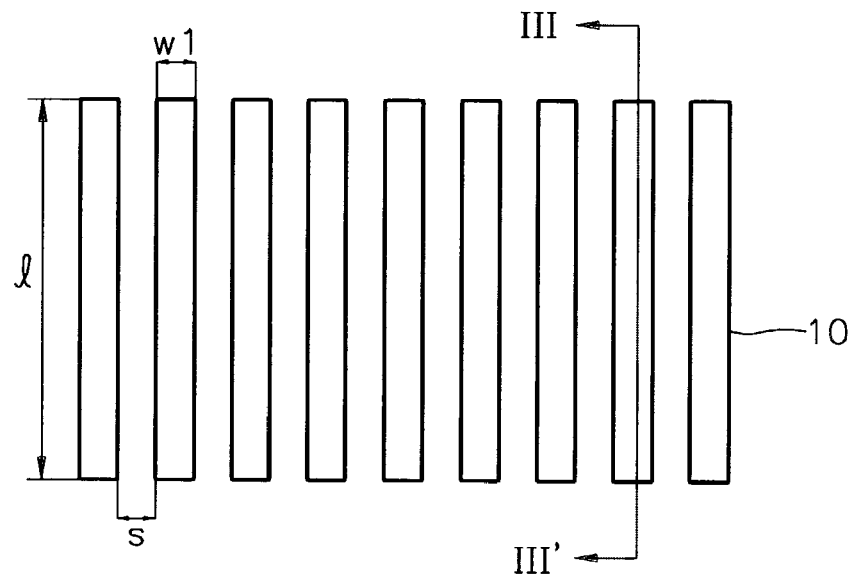
FIG. 1 is a plan view of a conventional alignment mark.
Figure 2:
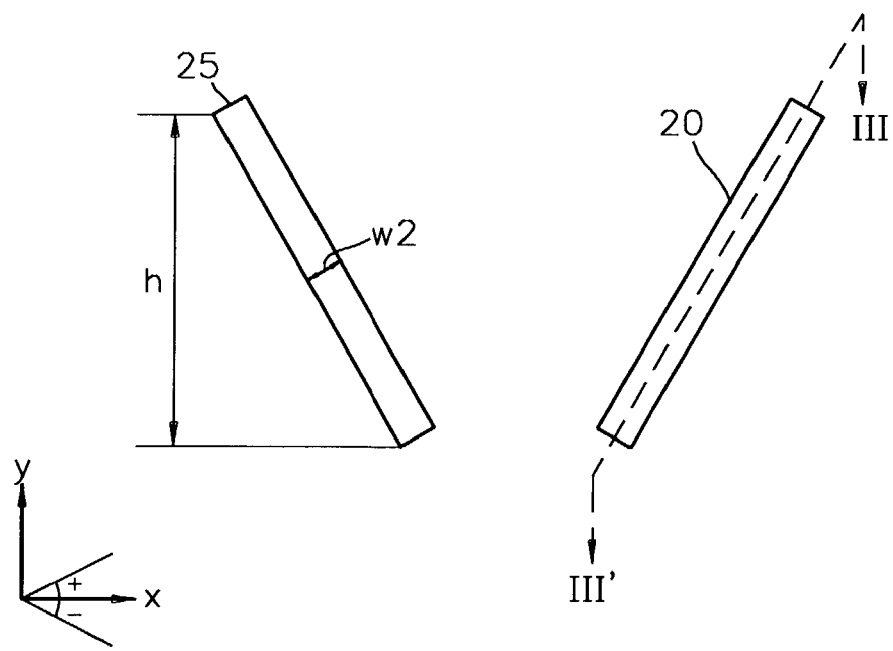
FIG. 2 is a plan view of another conventional alignment mark.
Figure 3:
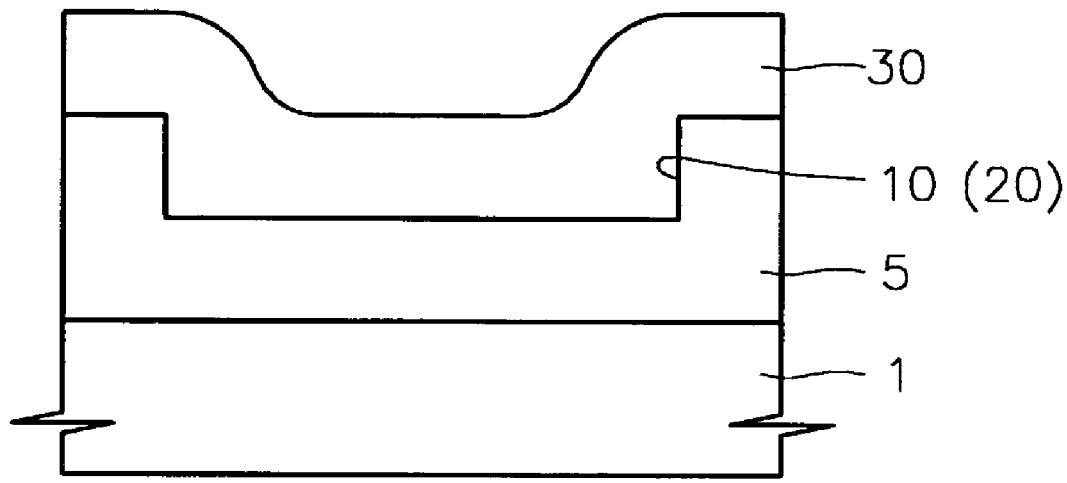
FIGS. 3 and 4 are sectional views of the alignment marks of FIGS. 1 and 2 taken along lines III–III', respectively, illustrating damage to the alignment mark due to chemical mechanical polishing (CMP)
Figure 4:
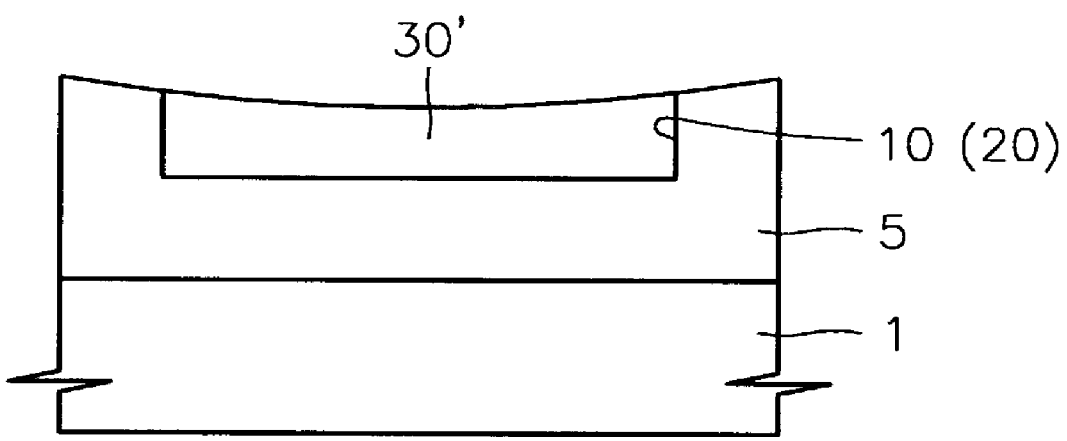

The present invention will now be described more fully hereinafter with reference to the accompanying drawings. In the drawings, the thickness of layers and regions are exaggerated for the sake of clarity. Also, when a certain layer is referred to as being "on" another layer or substrate, it means that the certain layer can be disposed directly on the other layer or substrate, or layers may be present between the certain layer and the other layer or substrate mentioned. Furthermore, the elements are shown in simplified forms in the schematic diagrams.

The alignment mark according to the present invention is formed under the layer targeted by the chemical mechanical polishing process. The alignment mark is used to produce alignment signal waves for an alignment exposure process. Generally speaking, the alignment mark is defined by a plurality of mesas or trenches arranged as densely as possible, so that no dishing occurs in the CMP process target layer.

Figure 5:
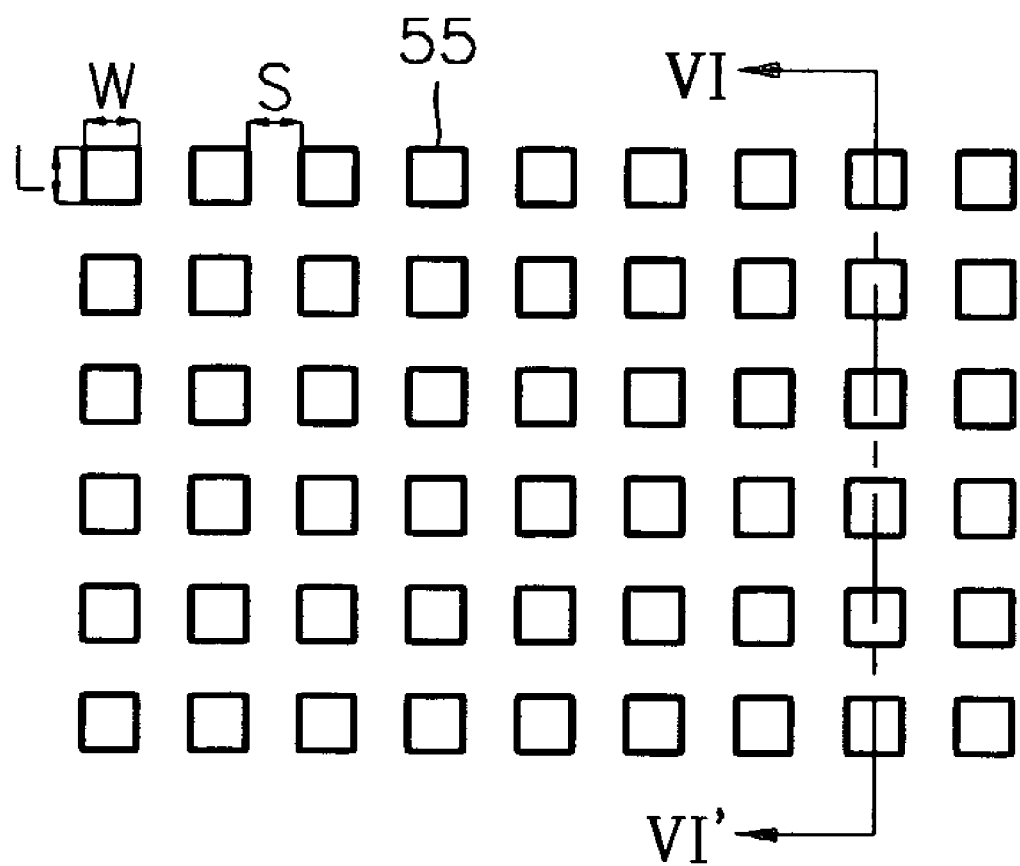
FIG. 5 is a plan view of a first embodiment of an alignment mark according to the present invention.
Figure 6A:
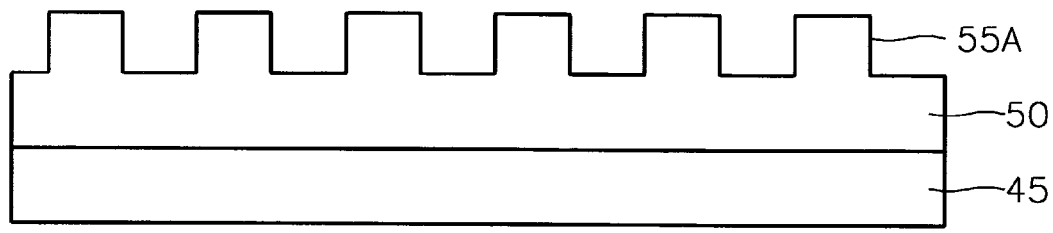
FIGS. 6A and 6B are sectional views of the alignment mark of FIG. 5 taken along line VI–VI'.

Referring first to FIG. 5, the first embodiment of the alignment mark according to the present invention is composed of a plurality of non-contiguous sections 55. More specifically, as shown in FIG. 6A, a plurality of lands 55A are patterned in a 2×2 or larger array in an insulating layer 50 formed on a wafer substrate 45. Alternatively, as shown in FIG. 6B, a plurality of trenches 55B are formed in a 2×2 or larger array in the insulating layer 50 formed on the wafer substrate 45.

Figure 6B:
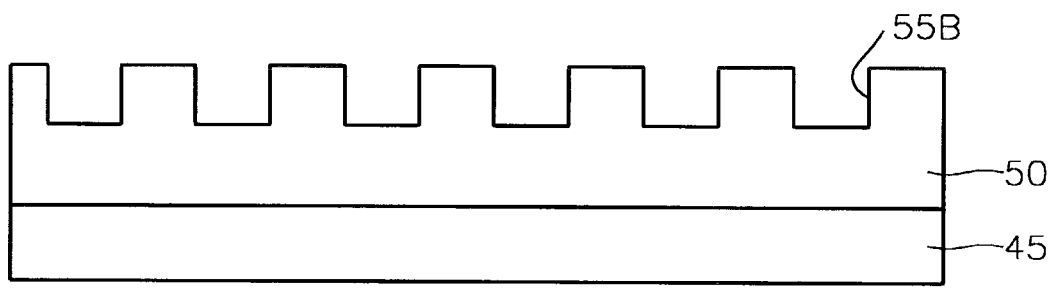

FIGS. 6A and 6B show the alignment mark being formed in the layer 50 in which a line pattern (not shown) of the semiconductor device will also be present. However, the alignment mark may instead be formed in the wafer substrate 45 on which the layer 50 is formed.

Figure 7:
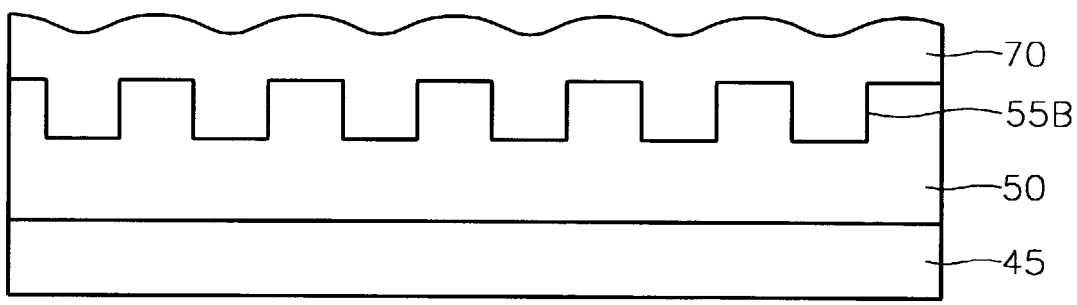
FIGS. 7 and 8 are sectional views of the alignment mark of FIG. 5 taken along line VI–VI', before and after it has experienced the CMP process.
Figure 8:
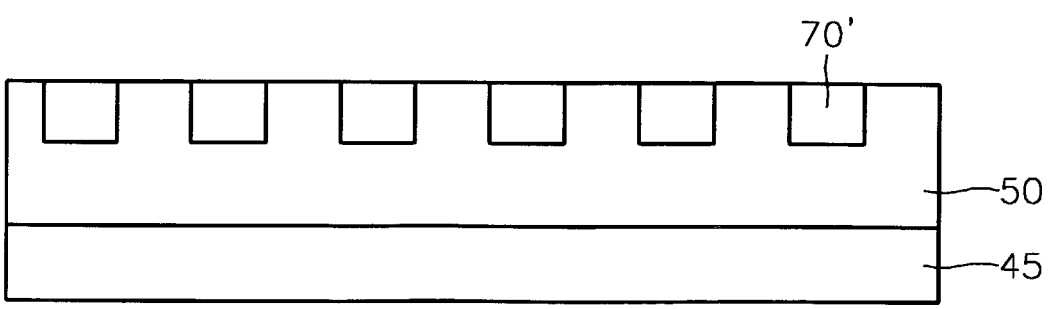

The plurality of lands 55A or trenches 55B are arranged as densely as possible, so that no dishing occurs in the CMP process target layer, thereby preventing the alignment mark from being damaged by the CMP process. More specifically, the constituent surface feature 55 of the alignment mark preferably has a width W of 4~7 μm and a length L of 4~7 μm, and the distance between adjacent features 55 is preferably 5~8 μm. As shown in FIG. 7, the CMP process target layer 70 is formed on the wafer over the layer 50 in which the alignment mark is formed. By providing an alignment mark having the dimensions set out above beneath the CMP target layer 70, when the target layer 70 undergoes the conventional CMP process to remove the portion thereof above the upper surface of the insulating layer 50, the processed layer 70' will not exhibit the dishing phenomenon, i.e., the upper surface of the insulating layer 50 and the processed layer 70' are coplanar as shown in FIG. 8.

Also, because the alignment mark of the present invention is in the form of an array of lands or trenches, the alignment mark can be easily discriminated from the line patterns of the semiconductor device.

The alignment mark according to the present invention is appropriate for use with an alignment system having an illumination source which produces broadband light beams. A broadband light beam is desirable because interference does not occur when portions of a broadband light beam are reflected from a photosensitive layer and from the surface of the wafer, respectively, when the alignment mark is illuminated. More specifically, when the thickness of the photosensitive layer is 1 μm and the wavelength of the broadband light exceeds 200 nm, any interference between the reflected light waves has little effect on the signal which is produced from the reflected light. Therefore, the alignment mark is appropriate for use with a field image alignment system which is a off-axis type of alignment system.

Figure 9:
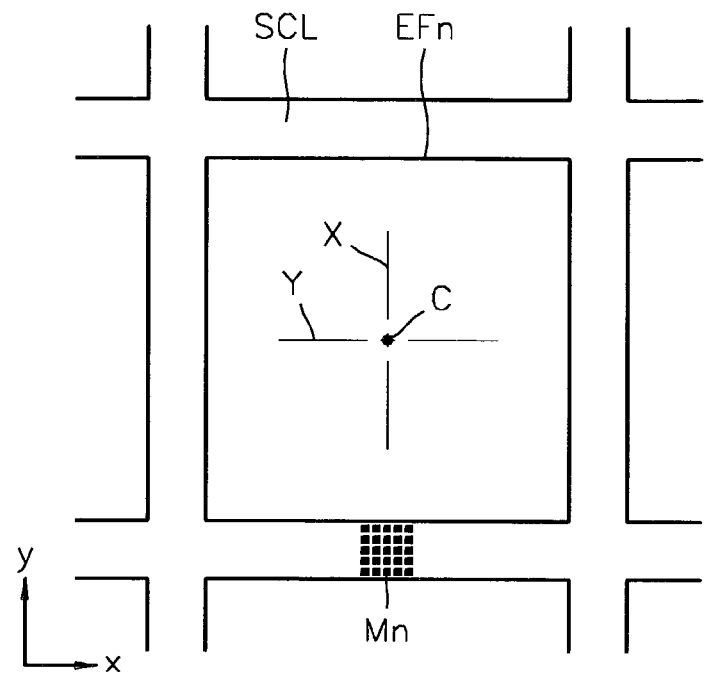
FIGS. 9 through 11 are plan views of a wafer bearing the first embodiment of an alignment mark according to the present invention.
Figure 10:
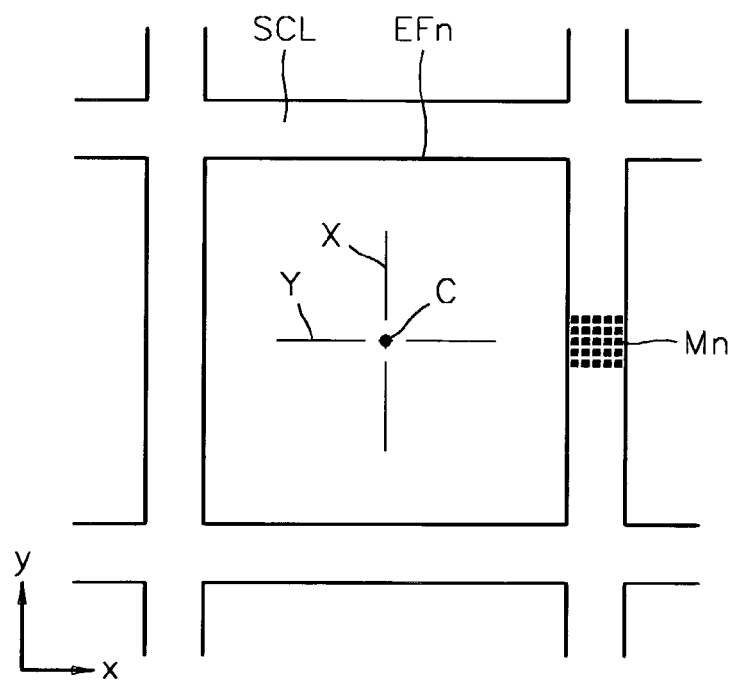
Figure 11:
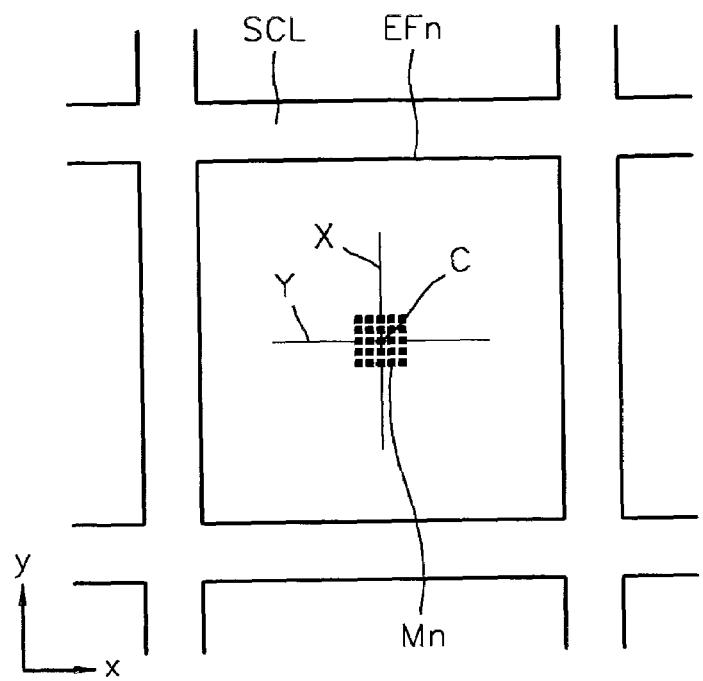

The alignment mark according to the present invention comprises an array (columns and rows of constituent features) so that signals in the form of waves can be produced by examining the alignment mark in both X-axis and Y-axis directions. Even when the array is anisotropic (m×n), a bidirectional signal wave can be produced. Preferably, however, the array is isotropic (n×n) so that the bi-directional signal wave produced can better facilitate the precision of the alignment process. And, because one alignment mark according to the present invention can be used to generate signals in both the X-axis and Y-axis directions, one alignment mark for each exposure field (EFn) is sufficient to facilitate a precise alignment process. For example, as shown in FIGS. 9 and 10, an alignment mark is formed within the region of a scribe line SCL of the wafer. In this case, the alignment mark Mn is preferably located along one of the X- and Y-axes having an origin at the center C of the exposure field (EFn). FIG. 11 shows a case of providing the alignment mark at the center C of the exposure field (EFn). And, although one alignment mark of the present invention is sufficient, a plurality of alignment marks can be produced to further enhance the precision of the alignment process by allowing information, such as that indicative of the angular position or the degree of distortion of an image, to be discerned.

Figure 12:
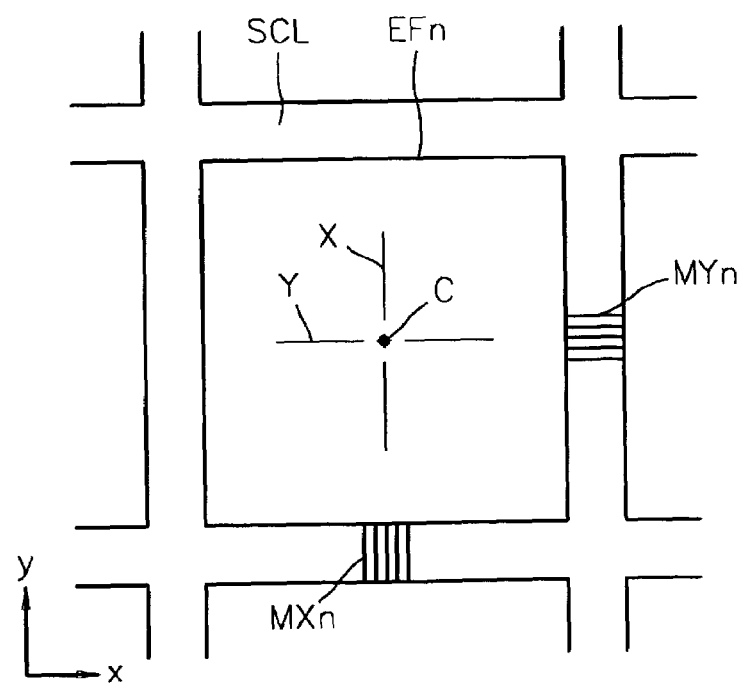
FIG. 12 is a plan view of the wafer bearing the conventional alignment mark of FIG. 1.

On the other hand, only uni-directional signal waves can be produced using a conventional field image alignment mark (FIG. 1). Thus, as shown in FIG. 12, the conventional wafer must include at least one alignment mark MXn on the X-axis and at least one alignment mark MYn on the Y-axis for each exposure field EFn.

As described above, a field image alignment mark of the present invention can be used to generate bi-directional signals. Thus, the number of alignment marks required on a wafer according to the present invention is half that required according to the prior art. Therefore, the area of the wafer which must be occupied by the alignment marks of the present invention is considerably less than the area of the same wafer which would have to be occupied by conventional alignment marks. The present invention thus allows more chips to be formed per wafer.

Also, during the alignment process, a wafer stage of the alignment apparatus of the exposure equipment must be moved to capture the image of the alignment mark(s) associated with each exposure field. Therefore, the wafer stage must be moved more along the X-axis and the Y-axis during the alignment of an exposure field according to the prior art, because the images of both of the conventional alignment marks associated with the exposure field must be captured. Accordingly, the alignment process using the single alignment mark associated with the exposure field according to the present invention is less time-consuming, thereby contributing to an increase in the yield in comparison with the prior art.

Figure 13:
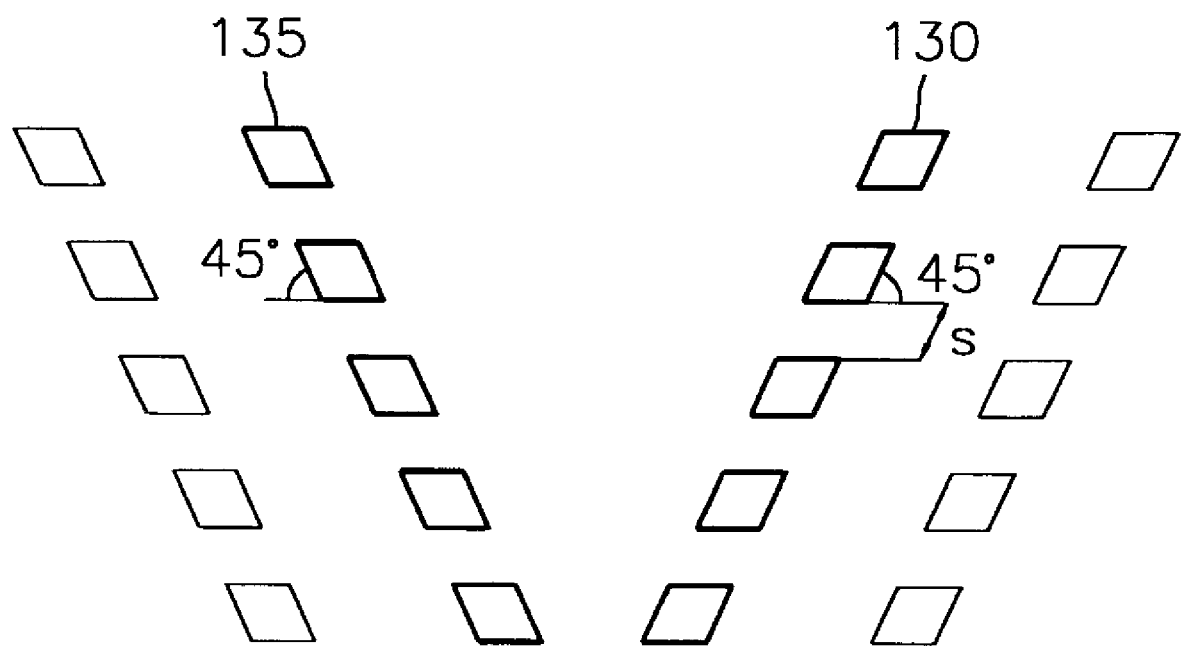
FIG. 13 is a plan view of a second embodiment of an alignment mark according to the present invention.

Now referring to FIG. 13, the second embodiment of the alignment mark according to the present invention has a discontinuous line pattern like that of the first embodiment. More specifically, the second embodiment of the alignment mark is formed of a plurality of spaced apart trenches or mesas 130 disposed along a line having a positive slope in an X-Y coordinate system (hereinafter referred to as a "plus pattern") and a plurality of spaced apart trenches or mesas disposed along a line having a negative slope in the X-Y coordinate system (hereinafter referred to as "a minus pattern"). The plus pattern and the minus pattern are arranged in the shape of a chevron.

The plus and minus surface features 130, 135 constituting the alignment mark are arranged as densely as possible to inhibit dishing from occurring in the CMP process target layer formed on the alignment mark. Thus, each surface feature has a bottom surface having a width of 1~2 μm, and a height of 3~5 μm, and adjacent surface features are spaced apart from one another by a distance S of 1~3 μm. In another form of the alignment mark, a pair of plus patterns and a pair of minus patterns may be provided, as shown by the dotted lines in FIG. 13. A greater number of patterns increases the precision of the alignment process.

Figure 14:
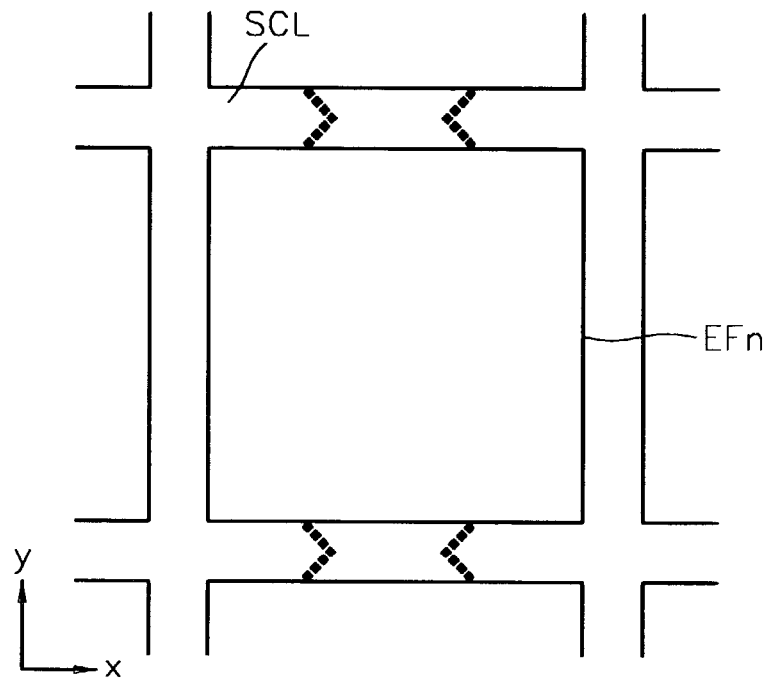
FIGS. 14 through 17 are plan views of wafers bearing the second embodiment of an alignment mark according to the present invention.
Figure 15:
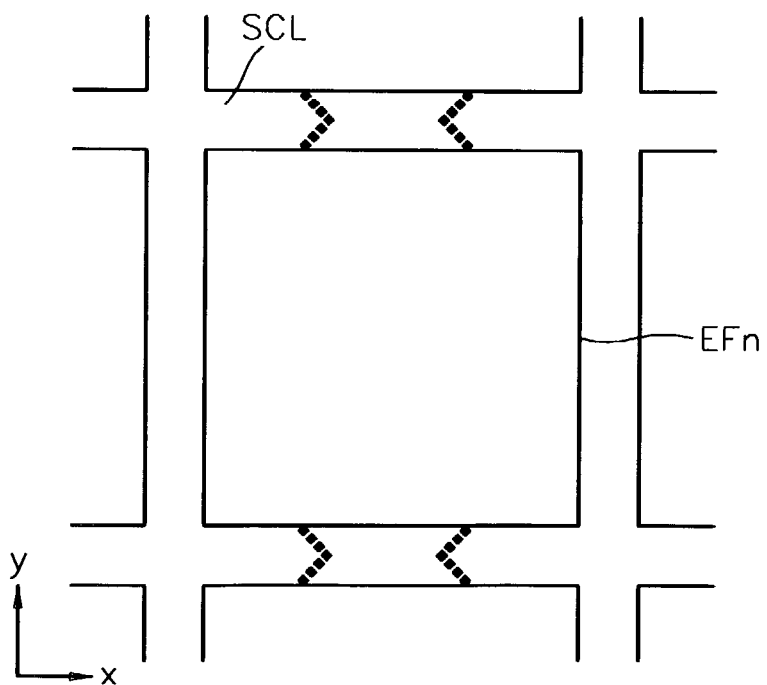
Figure 16:
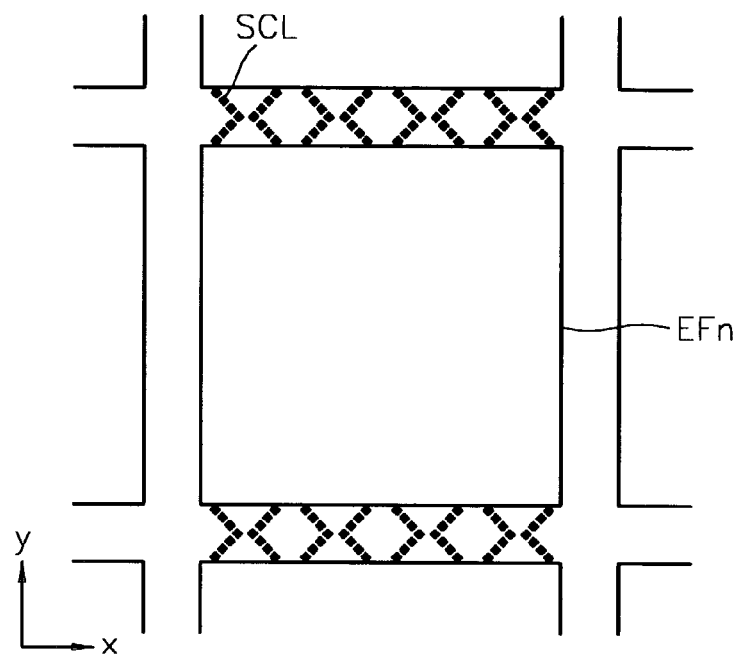
Figure 17:
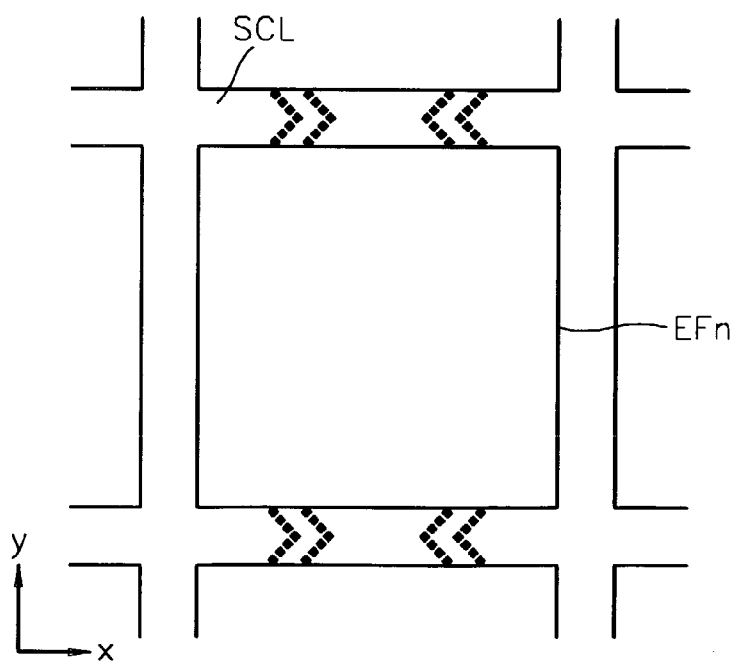

At least one pair of alignment marks in the shape of a chevron are associated with each exposure field EFn according to the present invention. The alignment marks are disposed symmetrically about the Y-axis (see FIG. 14) or about both the X and Y-axes. (see FIG. 15) within the region of upper and lower scribe lines SCLs between which the exposure field EFn is defined. A plurality of alignment marks may be provided in the region of each of the upper and the lower scribe lines as shown in FIG. 16. Alternatively, an alignment mark constituted by pairs of the plus and minus patterns may be formed in the region of each of the upper and lower scribe lines, as shown in FIG. 17.

Figure 18:
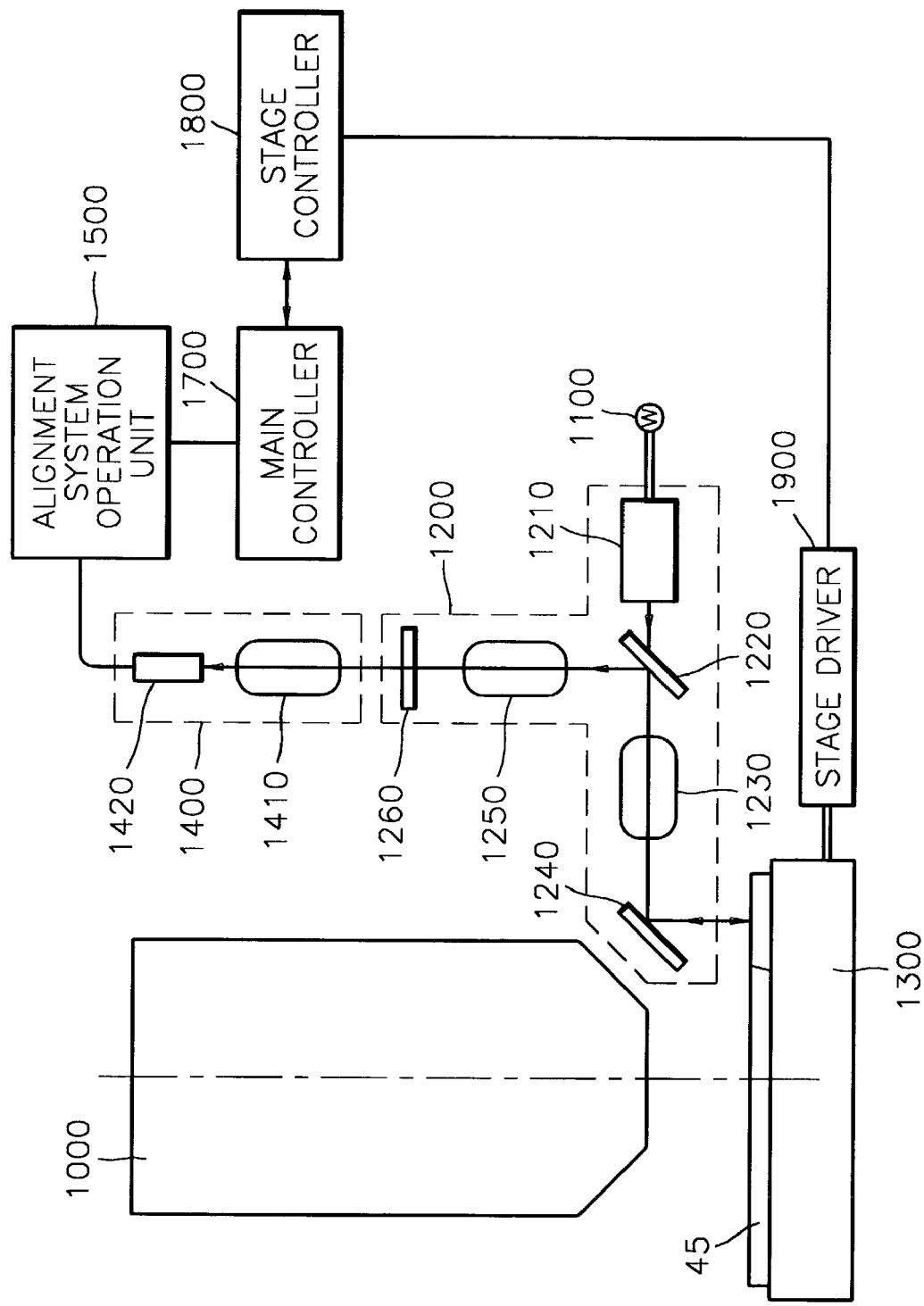
FIG. 18 is a schematic diagram of a first embodiment of an alignment system for use with the alignment mark according to the present invention.

An off-axis alignment system of exposure equipment for use with the first embodiment of the alignment mark is shown in FIG. 18. The off-axis alignment system is located externally of the projection lens 1000 of the exposure equipment. The projection lens 1000 faces a wafer stage 1300 to which the wafer 45 is mounted. The off-axis alignment system includes an illumination source 1100, a light transmitting unit 1200, a light collecting unit 1400, an alignment system operation unit 1500, a main controller 1700, a stage controller 1800 and a stage driver 1900.

The wafer 45 mounted to the wafer stage 1300 has (FIG. 19) a layer 80 to be patterned and a photosensitive layer 90. An inter-dielectric layer 50, having an alignment mark comprising a plurality of non-contiguous surface features 55B according to the present invention, is provided under the layer 80 to be patterned. When the alignment mark according to the present invention is used, a layer 70' may be formed by CMP at the boundary between the alignment mark 55B and the layer 80 to be patterned.

Figure 20:
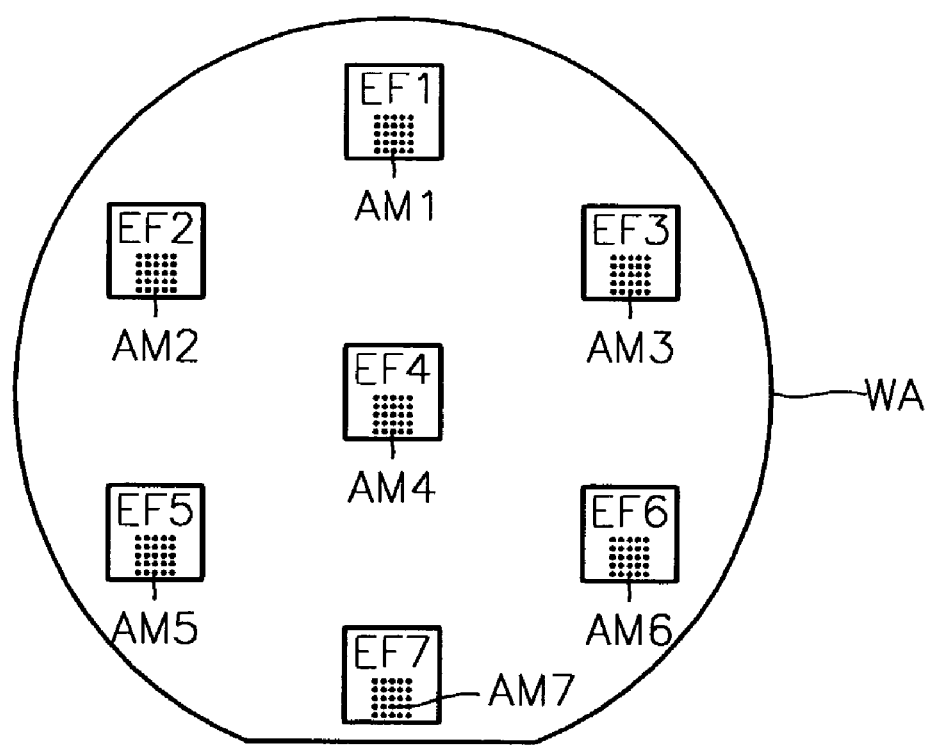
FIG. 20 is a map of an exposure field used by the alignment system of FIG. 18.

The wafer 45 is first pre-aligned using a flat portion of the periphery of the wafer. The alignment is refined based on an exposure field map as shown in FIG. 20. The exposure fields are selected and ordered EF1 through EF7 based on a scheme designed to minimize the time required for alignment and produce accurate data for alignment. As was mentioned above, only one alignment mark according to the present invention is required for each exposure field; however, a plurality of alignment marks can be provided to allow information on the angular position or the degree of distortion of an image to be discerned.

Figure 19:
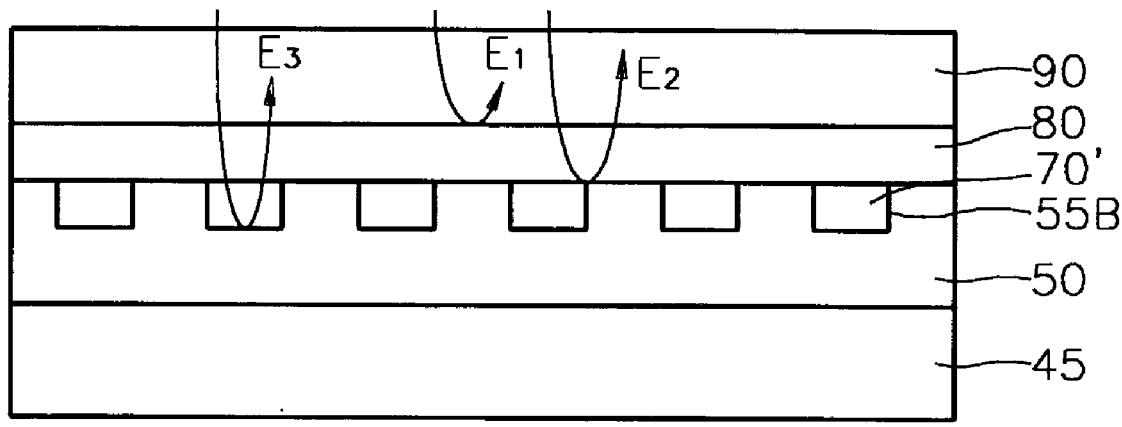
FIG. 19 is a sectional view of a wafer having the first embodiment of the alignment mark formed adjacent a photosensitive layer according to the present invention.

Referring back to FIG. 18, coordinates of the exposure fields EFs are input to the main controller 1700. The stage driver 1900 is operated via the stage controller 1800 according to the coordinates. The wafer stage 1300 moves the stage driver 1900 to position the alignment mark AM1 of the first exposure field EF1 at a measuring location. Once this happens, light beams are emitted from the illumination source 1100. The illumination source 1100 emits a broadband light beam to irradiate the alignment mark AM1. The light beams E1 (FIG. 19) reflected from the photosensitive layer 90 do not produce interference with light beams E2 or E3 reflected from the surface of the wafer and do not sensitize the photosensitive layer 90 (FIG. 19). More specifically, when the thickness of the photosensitive layer 90 is 1 μm and the bandwidth is more than 200 nm, the interference effect is negligible. Thus, a halogen lamp is generally used as the illumination source 1100.

Figure 21:
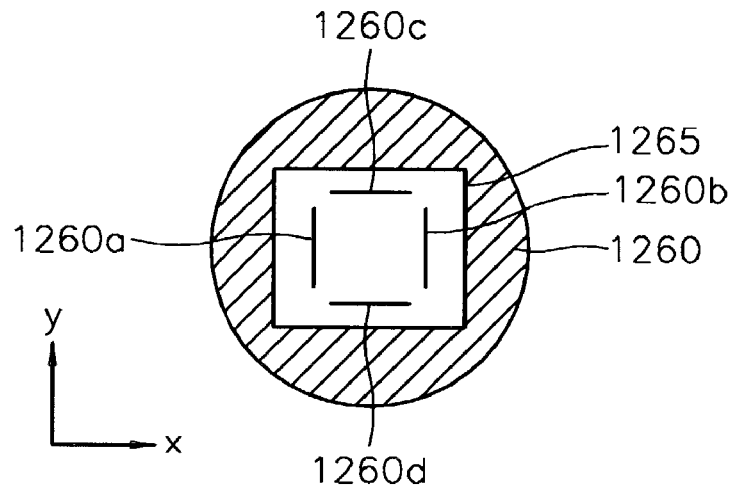
FIG. 21 is a plan view of an index plate of the alignment system of FIG. 18.

The light beams emitted from the illumination source are directed onto the alignment mark of the wafer 45 through a condensing lens 1210, a half mirror 1220, an objective lens 1230 and a prism 1240 of the light transmitting unit 1200. Subsequently, the light beams reflected from the alignment mark, i.e., an image of the alignment mark, pass through the prism 1240, the objective lens 1230 and the half mirror 1220. The image of the alignment mark is focused on an index plate 1260 by a lens system 1250. The index plate 1260 includes a tetragonal transparent window 1265 having linear index marks 1260a, 1260b, 1260c and 1260d extending in the directions of the X-axis and Y-axis, as shown in FIG. 21. Thus, the image of the alignment mark is focused on the transparent window 1265 of the index plate 1260. The images of the linear index marks 1260a through 1260d superimposed with the image of the alignment mark are transmitted to an image sensor 1420 through a relay system 1410 of the light collecting unit 1400 (FIG. 18).

The first embodiment of the alignment mark can be bi-directionally measured meaning that a light beam illuminating the alignment mark AM can produce alignment signal waves in both the X-axis and Y-axis directions. The image sensor 1420 is preferably a pixel type of camera by which the alignment signal waves can be displayed. Also, with a pixel type of camera, the plurality of signal waves produced, respectively, by the columns of surface features of the alignment mark can be added and then averaged to produce one Y-axis alignment signal wave, and the plurality of signal waves produced, respectively, by the surface features of the alignment mark can be simultaneously added and then averaged to produce one X-axis alignment signal wave.

Image signals in analog form are input to the alignment system operation unit 1500. The alignment system operation unit 1500 digitizes the analog image signals and then uses the digitized information to calculate the deviation of the alignment mark from the index marks.

Figure 22:
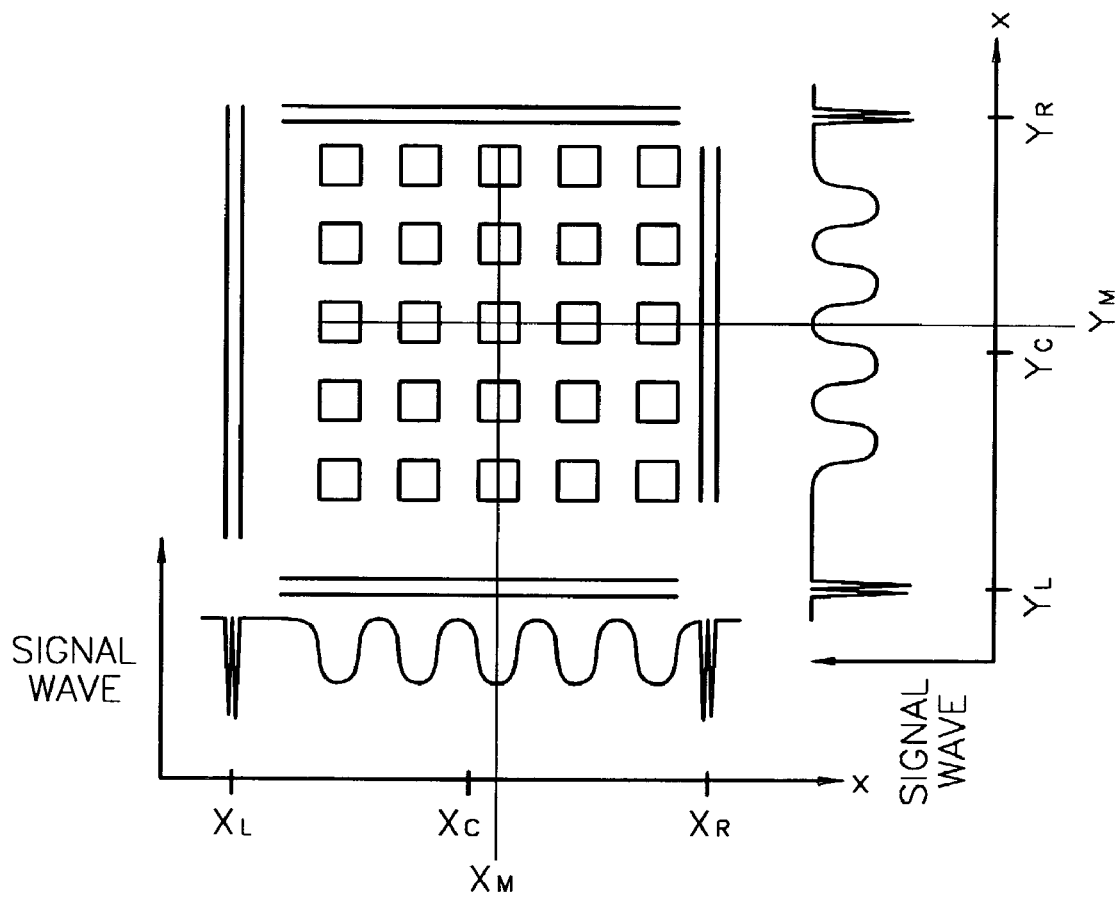
FIG. 22 is a conceptual diagram showing the alignment signal waves obtained from the first embodiment of the alignment mark according to the present invention and therefrom.

Referring to FIG. 22, the alignment system operation unit 1500 (FIG. 18) calculates the center $X_C$ between index marks $X_L$ and $X_R$ of the X-axis and the center $X_M$ of the measured value of the X-axis signal wave, to calculate the deviation between both centers, where $\Delta X = X_C - X_M$. Also, the center $Y_C$ between index marks $Y_L$ and $Y_R$ of the Y-axis and the center $Y_M$ of the measured value of the Y-axis signal wave is calculated. Finally, the deviation of both centers, where $\Delta Y = Y_C - Y_M$ is calculated. The deviations $\Delta X$ and $\Delta Y$ are input to the main controller 1700. Subsequently, if there are other non-examined alignment marks remaining in the first exposure field EF1, other deviations $\Delta X$ and $\Delta Y$ are obtained by repeating the above-described steps for these alignment marks. When the examination of the alignment mark(s) associated with the exposure field EF1 has been completed, the stage driver 1900 is driven by the stage controller 1800 according to the exposure field map stored in the main controller 1700. Thus, the wafer stage is driven to move the next exposure field EF2 to a position in which alignment signals for that field can be obtained. The above-described steps are sequentially performed until alignment signals for the seventh exposure field EF7 are obtained.

Figure 23:
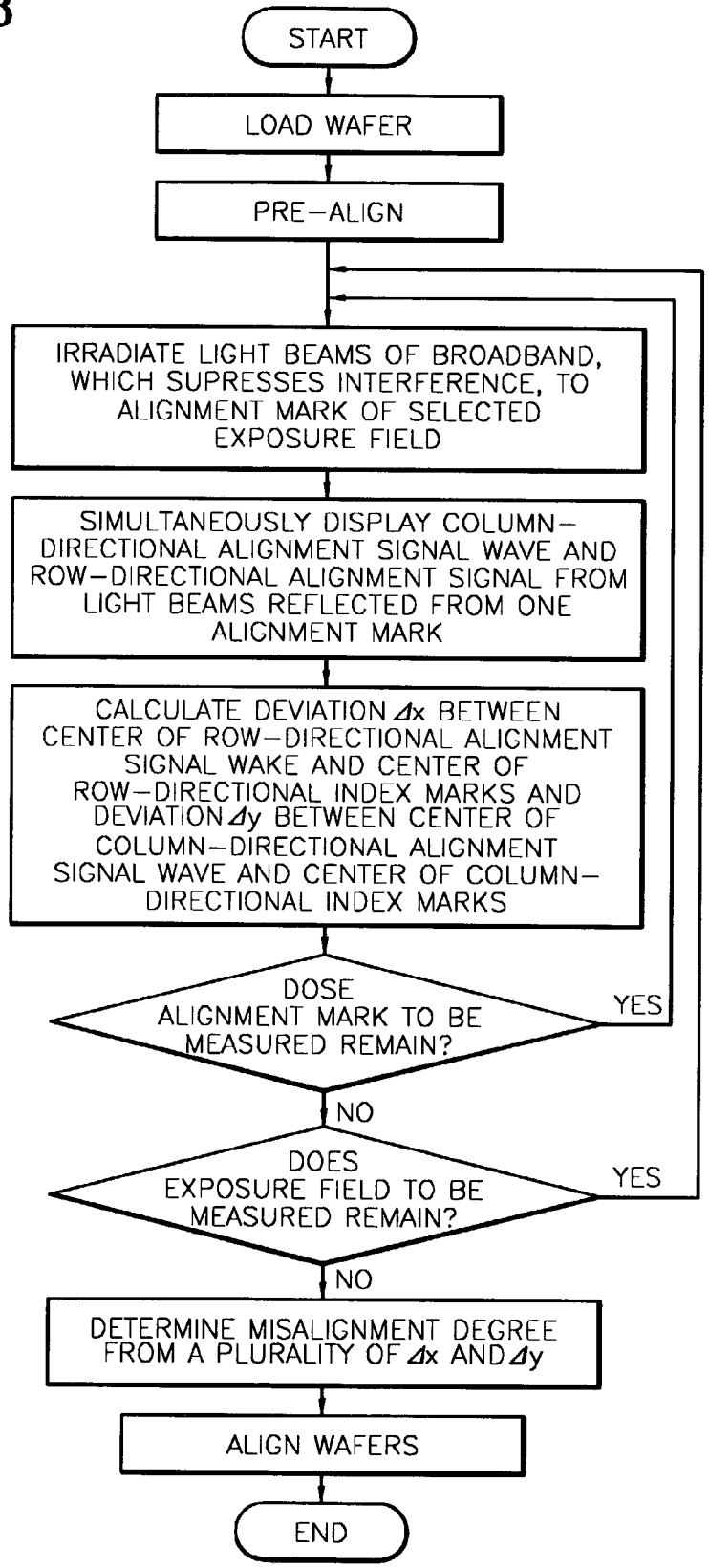
FIG. 23 is a flowchart of a first embodiment of a method of aligning exposure equipment and a wafer using the alignment mark according to the present invention.

When the alignment signals for all of the exposure fields EF1–EF7 are obtained, the main controller 1700 determines the degree and the form of mis-alignment from a plurality of data ΔX and ΔY. The stage driver 1900 is driven through the stage controller 1800 so that the wafer stage 1300 is moved to accurately align the wafer. The above-described steps are shown in the flow chart of FIG. 23.

Figure 24:
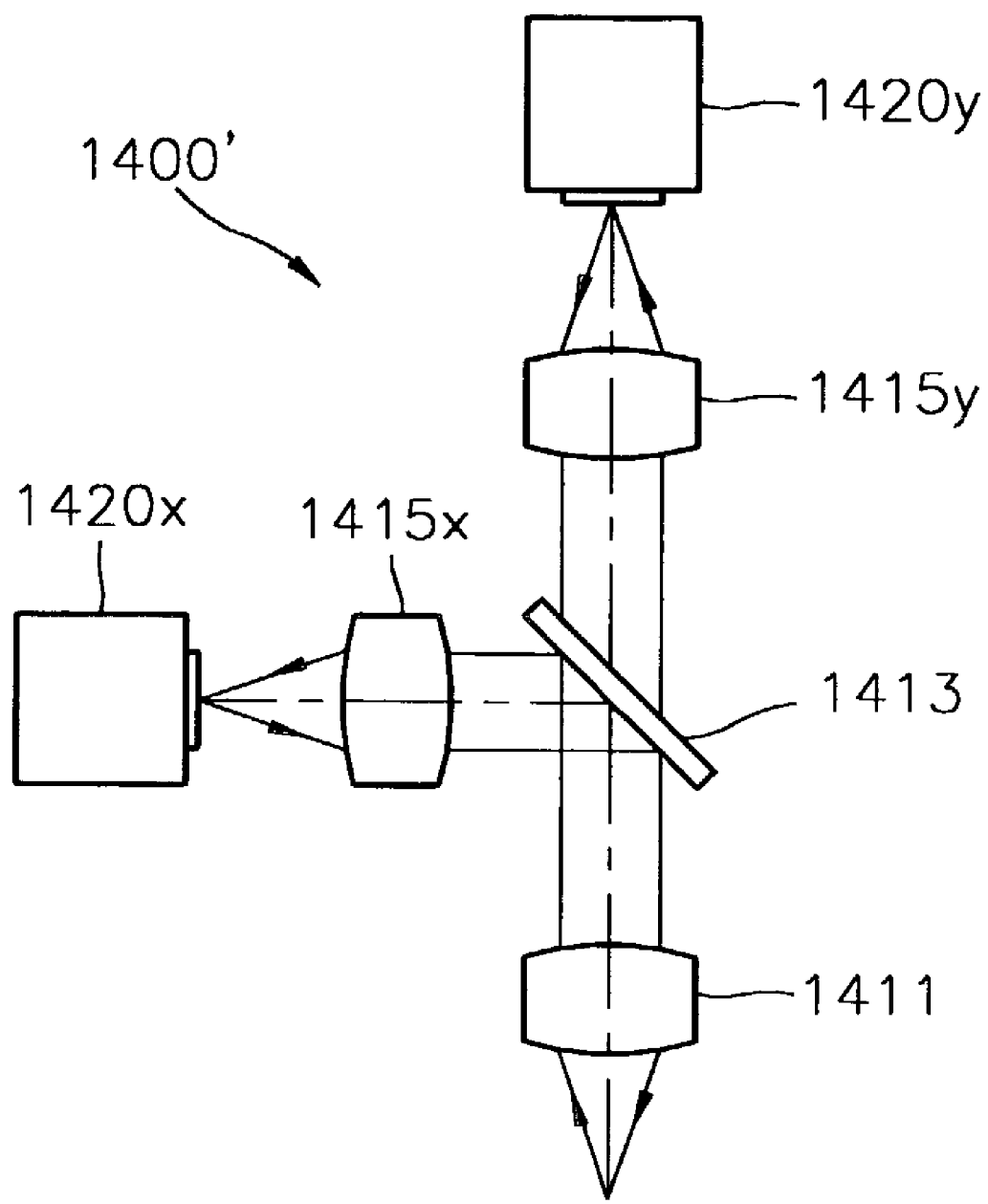
FIG. 24 is a schematic diagram of a light collecting unit of the exposure system aligned with a wafer using the alignment mark according to the present invention.

FIG. 24 shows an alternative form 1400' of the light collecting unit 1400 of the alignment exposure system. The light collecting unit 1400' employs a conventional scanning type of image sensor. Nonetheless, the light collecting unit 1400' can simultaneously display X-axis and Y-axis alignment signals produced using the first embodiment of the alignment mark. The image of the alignment mark image together with the images of the index marks are transmitted to a beam splitter 1413 through a release lens 1411. The beam splitter 1413 divides the superimposed images of the index marks and the alignment mark into X-axis images and Y-axis images and transmits the X-axis images to an X-axis release lens 1415x and the Y-axis images to a Y-axis release lens 1415y, respectively. The transmitted images are displayed on an X-axis image sensor 1420x using a scanning line parallel to the X-axis and a Y-axis image sensor 1420y using a scanning line parallel to the Y-axis, respectively. Also, image signals displayed on each of the image sensors 1420x and 1420y are transmitted to the alignment system operation unit 1500.

Figure 25:
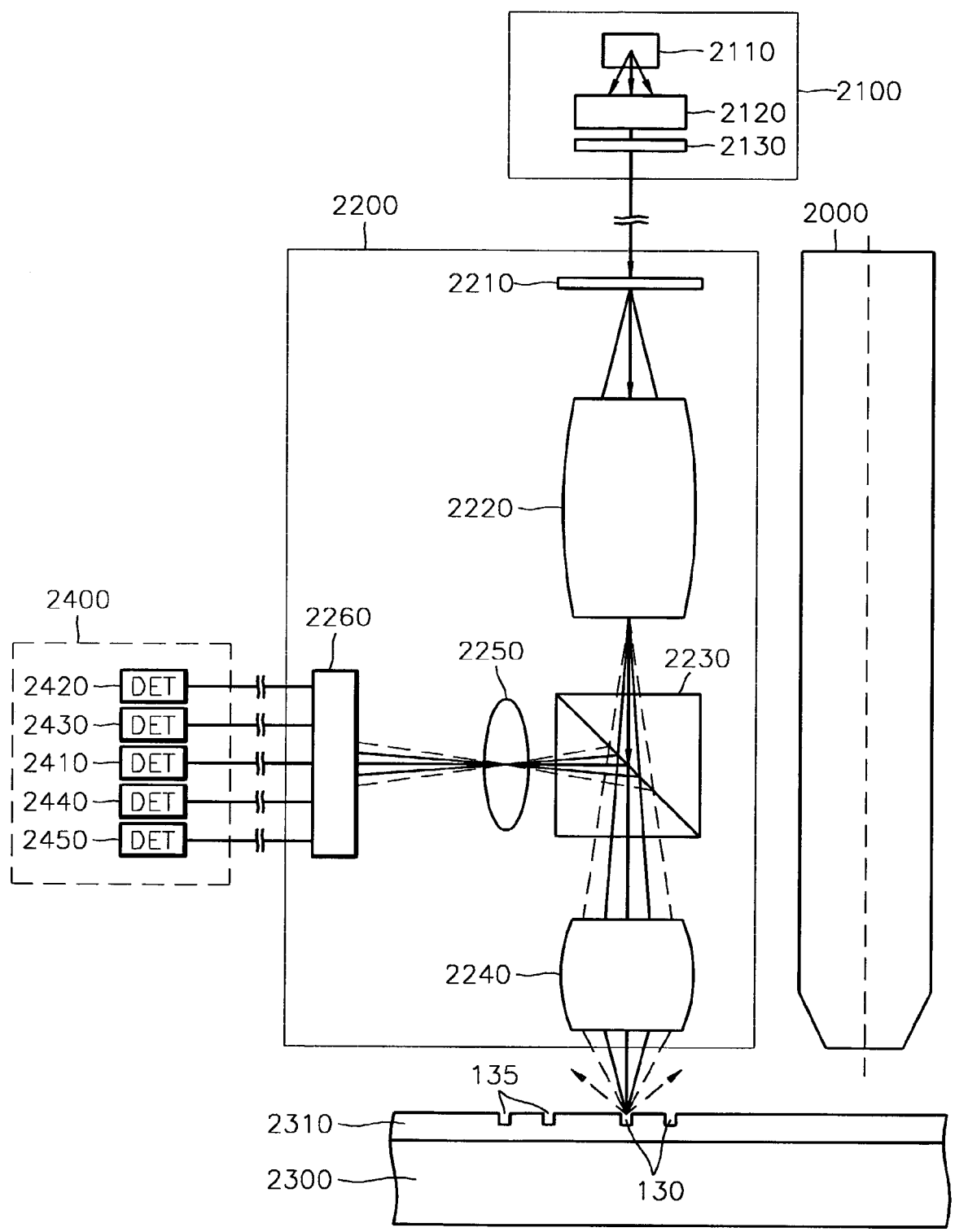
FIG. 25 is a schematic diagram of a second embodiment of an alignment system for use with the second embodiment of the alignment mark according to the present invention.

An alignment system of exposure equipment for use with the second embodiment of the alignment mark according to the present invention and an alignment method using the same will now be described with reference to FIGS. 25 through 30. As shown in FIG. 25, the alignment system is an off-axis scanning alignment system. More specifically, the alignment system is provided externally of the projection lens 2000 of the exposure equipment, and comprises an alignment illumination unit 2100, an alignment sensor head 2200 and an alignment detection unit 2400.

A wafer 2310 having chevron-shaped alignment marks according to the present invention, and a layer to be patterned and a photosensitive layer sequentially formed thereon, is mounted to a wafer stage 2300. A layer having undergone CMP may be present at the boundary between the alignment mark and the layer to be patterned. The loaded wafer 2310 is pre-aligned using a flat portion of the periphery of the wafer.

Subsequently, the sample exposure fields are selected by a process similar to that mentioned above. When the exposure field EF1 is positioned by the wafer stage 2300 below the alignment sensor head 2200, light from an illumination source 2110 of the illumination source unit 2100 irradiates the exposure field EF1. The illumination source 2110 emits broadband light beams which prevent light beams reflected from the photosensitive layer and light beams reflected from the surface of the wafer from interfering with each other as well as from sensitizing a photosensitive layer on the wafer 2310. For instance, the exposure field EF1 is irradiated with a continuous spectrum of light of a wavelength of 400 nm~700 nm are emitted.

The bands of light emitted from the illumination source 2110 having a wavelength of 400 nm or less and 700 nm or more are reflected or absorbed by an optical system 2120 and a dielectric glass filter 2130 so that a spectrum of light having a wavelength of 400 nm~700 nm is transmitted to the alignment sensor head 2200. The light beams transmitted to the alignment sensor head 2200 pass through a reticle 2210, and then the light beams are transmitted to a beam splitter 2230 through a first lens system 2220. An intermediate image, i.e., an image of the reticle 2210, is transmitted onto the surface of the wafer 2310 through a second lens system 2240. The light beams transmitted onto the surface of the wafer 2310 are reflected and scattered by the wafer 2310. The reflected and scattered light propagates back to the beam splitter 2230 via the second lens system 2240. The light beams propagating to the beam splitter 2230 are transmitted to a detection mask 2260 via a third lens system 2250. Finally, five detectors 2410, 2420, 2430, 2440 and 2450 of the alignment detection unit 2400 measure the distribution of the light beams reflected and scattered by the wafer to generate electric signals. The electric signals are processed to determine the positions of the plus and minus patterns 130 and 135 of the alignment mark.

Figure 26:
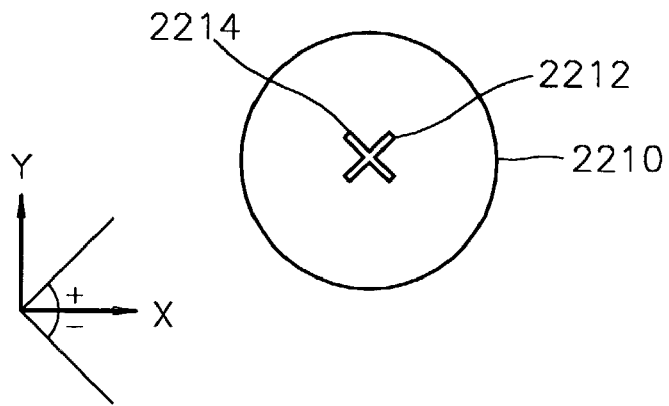
FIG. 26 is a plan view of a reticle of the alignment system of FIG. 25.

FIG. 26 is a plan view of the reticle 2210. The reticle 2210 has a transparent alignment cross pattern. The alignment cross pattern is formed of two straight intersecting portions 2212 and 2214. The length and width of intersecting portion 2212 are the same as those of the intersecting portion 2214.

Figure 27:
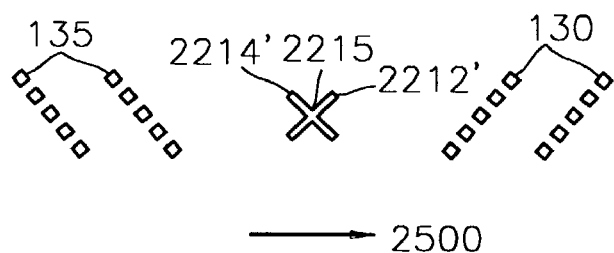
FIG. 27 shows an alignment mark on a wafer superimposed with an image of an alignment cross pattern projected from the reticle onto the wafer.

FIG. 27 shows the alignment mark on the wafer 45 superimposed with an image 2215 of the alignment cross pattern of the reticle. The arrow 2500 indicates a direction in which the image 2215 is scanned across the wafer. The image 2215 of the alignment cross pattern of the reticle includes a straight line image 2212' parallel to the plus pattern 130 of the alignment mark, and a straight line image 2214' parallel to the minus pattern 135.

Figure 28:
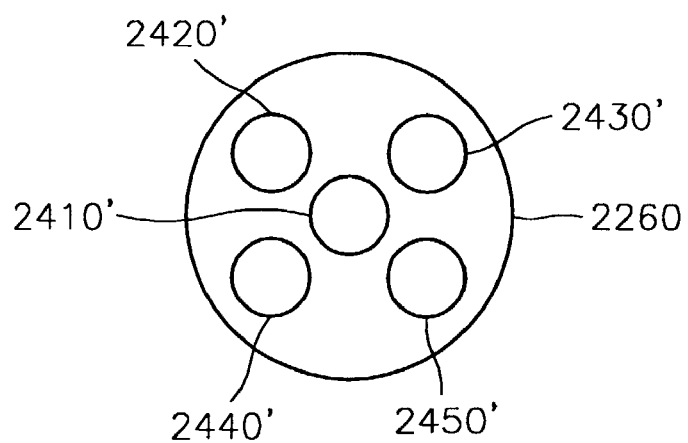
FIG. 28 is a plan view of a detection mask of the alignment system of FIG. 25.

FIG. 28 shows the detection mask 2260. The detection mask includes five transmission regions 2410', 2420', 2430', 2440' and 2450', which correspond to the five detectors 2410, 2420, 2430, 2440 and 2450 of the alignment detection unit 2400. The central first transmission region 2410' collects light beams reflected from the wafer. The second transmission region 2420' collects light beams scattered to the left side by the plus pattern 130, the third transmission region 2430' collects light beams scattered to the right side by the minus pattern 135, the fourth transmission region 2440' collects light beams scattered to the left side by the minus pattern 135, and the fifth transmission region 2450' collects light beams scattered to the right side by the plus pattern 130.

When the wafer is scanned at a predetermined speed along the scanning direction 2500, alignment signals are generated. In this process, the image 2215 of the alignment cross pattern of the reticle remains fixed and the wafer is moved. Therefore, at any one time, a straight line image 2212' or 2214' of the alignment cross pattern of the reticle 2210 may or may not coincide with a plus or minus pattern 130 and 135 of the alignment mark on the wafer. In the latter case, only the light beams reflected from the surface of the wafer are collected by the first transmission region 2410' of the detection mask. The collected light beams are transmitted to the detector as electric signals. In the former case, light beams are scattered by the plus or minus pattern 130 and 135, and the scattered light beams are collected by the transmission regions 2420', 2430', 2440' and 2450' in amounts based on the orientation of the alignment mark. These collected light beams are also transmitted to a corresponding detector as electric signals.

Figure 29:
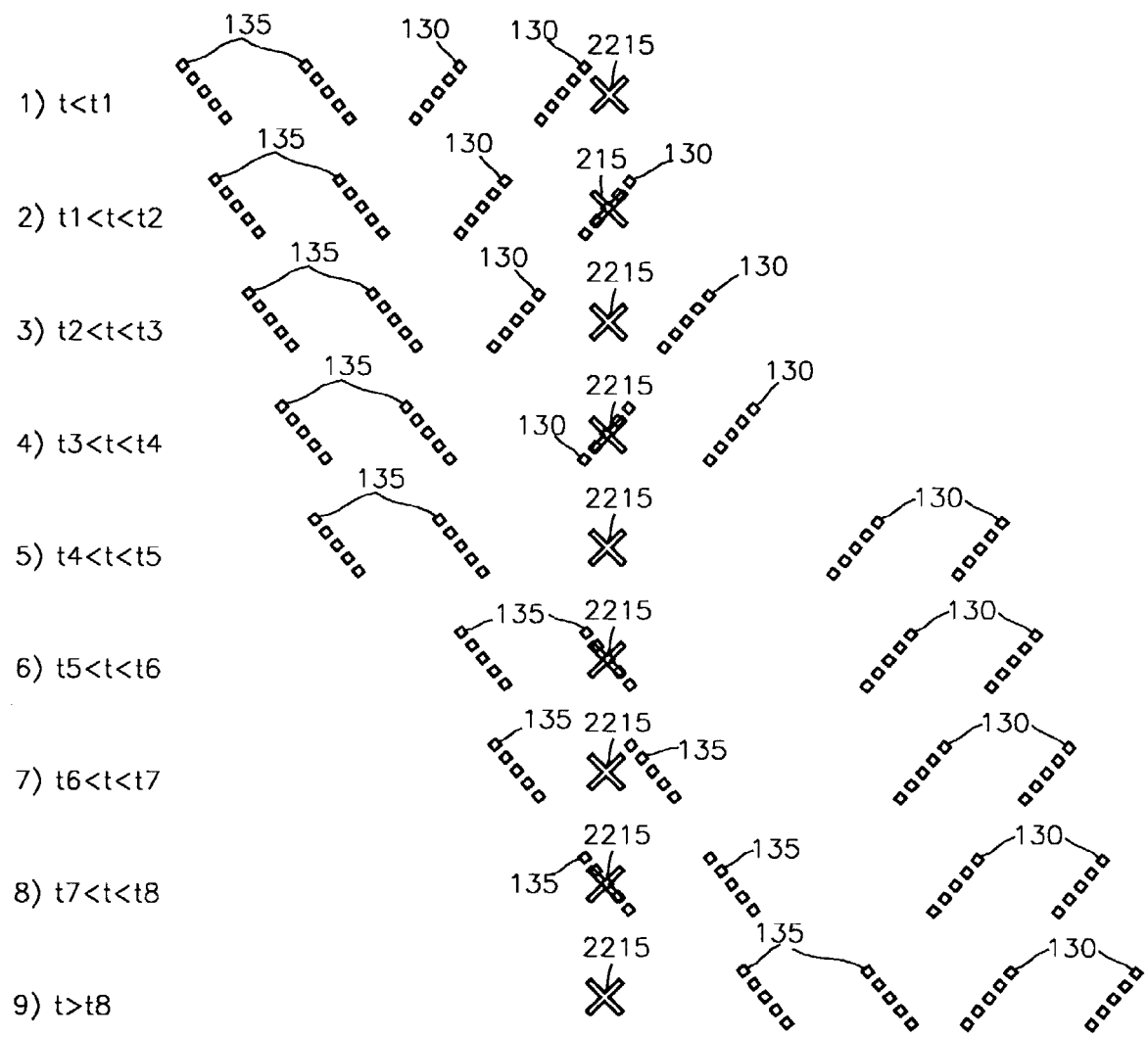
FIG. 29 is a schematic diagram showing the relationship between the image of the alignment cross pattern of the reticle and the alignment mark of the wafer as the wafer is being scanned.
Figure 30:
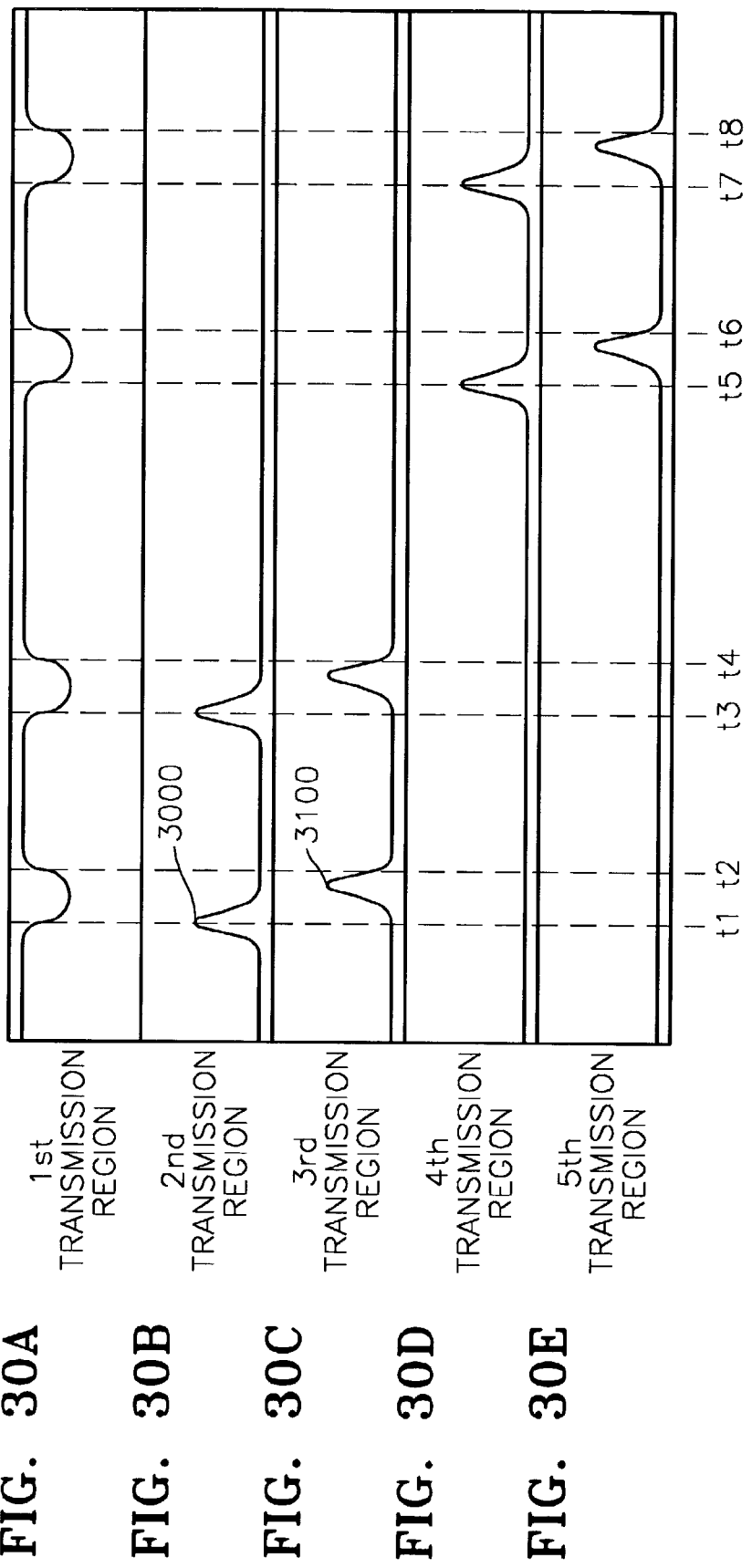
FIGS. 30A through 30E are graphical representations of the alignment signals produced by the alignment system of FIG. 25.

FIG. 29 shows the relationship between an image 2215 of the alignment cross pattern of the reticle 2210 and the alignment mark on the wafer, and FIGS. 30A through 30E are graphs of the electric signals obtained during a time period of t1 to t8.

That is, during the time periods t<t1, t2<t<t3, t4<t<t5, t6<t<t7, and t>t8, the alignment mark and the image 2215 of the alignment cross pattern of the reticle 2210 do not coincide. Thus, incident light only reflects from the surface of the wafer. Accordingly, signals from the first transmission region 2410' are high and signals from the other transmission regions 2420', 2430', 2440' and 2450' are low, as shown in FIG. 30A.

On the other hand, during the time periods t1<t<t2, and t3<t<t4, the plus pattern 130 of the alignment mark coincides with the image 2215 of the alignment cross pattern of the reticle 2210. Thus, light beams scattered to the left and right by the plus pattern 130 are collected by the second transmission region 2420' and the fifth transmission region 2450', respectively. Accordingly, the signals from the second and the fifth transmission regions 2420' and 2450' are high during these time periods, as shown in FIGS. 30B and 30C.

Also, during the time periods t5<t<t6, and t7<t<t8, the minus pattern 135 of the alignment mark coincides with the image 2215 of the alignment cross pattern of the reticle 2210. Thus, light beams scattered to the right and left by the minus pattern 135 are collected by the third and the fourth transmission regions 2430' and 2440', respectively. Accordingly, the signals from the third and the fourth transmission regions 2430' and 2440' are high during these time periods, as shown in FIGS. 30D and 30E.

Subsequently, the relative position of the alignment mark is determined from the alignment signals shown in FIGS. 30A through 30E. The center of the alignment mark is determined based on a signal produced by light scattered to the right and a signal produced by light scattered to the left by the alignment mark. For instance, the time at which the left signal 3000 and the right signal 3100 are produced are averaged. This yields the midpoint in time between the generation of the left and right signals, thereby indicating the center of the plus pattern 130.

An accurate position of the alignment mark is calculated using the technique described above. The relative position of the wafer can be readily determined based on the calculated position of the alignment mark, and such information can in turn be used to accurately align the wafer with the exposure equipment in preparation for photo-processing.

Although the second embodiment of the alignment system described above is an off-axis alignment system, the second embodiment of the present invention can nonetheless be configured as a through the lens (TTL) alignment system in which elements of the alignment system disposed along the same optical axis as the transmission lens of the exposure equipment.

Alignment signals produced according to the present invention were compared to those produced according to the prior art. One such a comparison is described below.

A sample wafer having an alignment mark according to the present invention was prepared. First, an oxide layer having a thickness of 9000 Å was formed on a wafer substrate. Eighty-one trenches each having a length of 6 µm and a width of 6 µm were then formed in the oxide layer. The distance between the trenches was 6 µm and the pattern of the trenches was a 9×9 array. The depth of the trenches was 9000 Å. Subsequently, a tungsten layer was formed over the entire surface of the resultant structure, and then tungsten plugs were formed in the trenches by subjecting the tungsten layer to chemical mechanical polishing (CMP). An aluminum layer having a thickness of 6000 Å was formed over the entire surface of the resultant structure, and the resultant structure was in turn coated with a photosensitive layer to complete the sample. Alignment waveform signals were obtained from the alignment mark of the sample wafer using the exposure system of FIG. 18. The result is shown in FIG. 31.

A control sample was prepared using the same processes and conditions described above. However, the alignment mark was formed of nine line trenches each having a length of 30 µm, a width of 6 µm, and separated from one another by a distance of 6 µm, as shown in FIG. 1. An alignment waveform signal was obtained from the alignment mark of the control sample by also using the exposure system of FIG. 18. The result is shown in FIG. 32.

Figure 31:
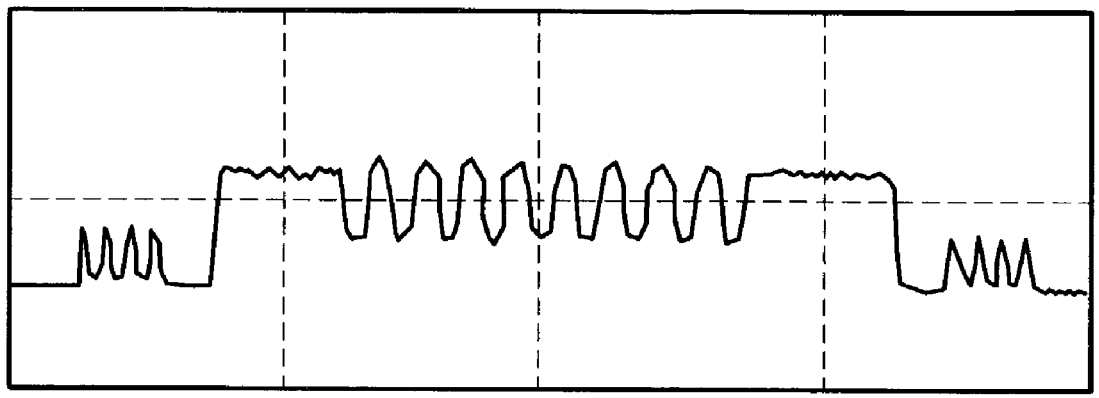
FIG. 31 is a photograph of a display showing alignment signal waves produced from the first embodiment of the alignment mark according to the present invention.
Figure 32:
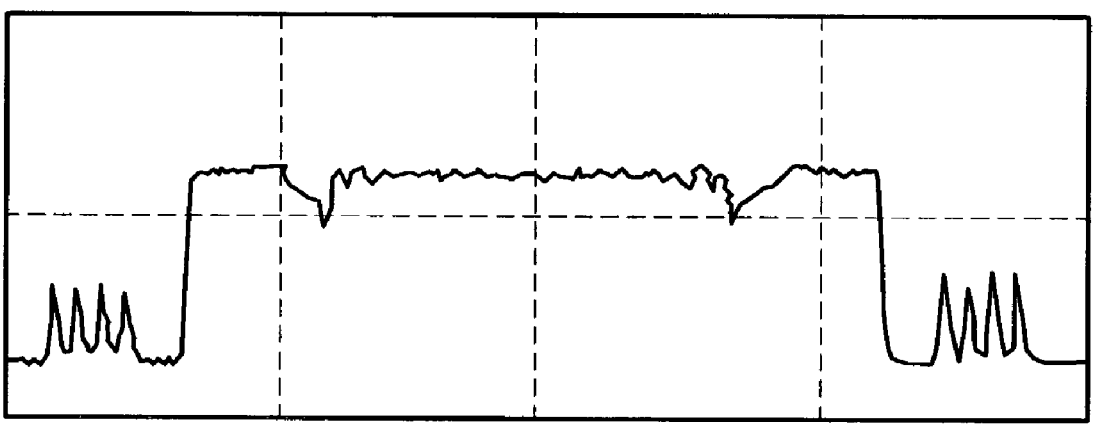
FIG. 32 is a photograph of a display showing alignment signal waves produced from the conventional field image alignment mark.

One can see from FIGS. 31 and 32, that the first embodiment of the alignment mark according to the present invention provided an alignment waveform signal of a much greater resolution than that which was produced from the alignment mark of the prior art. The figures thus also indicate that no dishing occurred in the tungsten CMP target layer when the alignment mark of the present invention was used as the underlayer, i.e., the tungsten plugs were free of concavities despite having been produced by CMP. On the other hand, the low resolution of the waveform and the non-uniformity in the waveform pattern of the signal shown in FIG. 31 indicates that dishing occurred during the CMP process for forming the tungsten plugs in the case where the conventional alignment mark shown in FIG.1 was used as the underlayer. In other words, the poor alignment signal shown in FIG. 31 indicates that the alignment mark was damaged by the CMP process.

Although the present invention has been described in detail above with respect to the preferred embodiments thereof, many changes to and modifications of the described invention will become apparent to those of ordinary skill in the art. All such changes and modifications are seen to be within the true spirit and scope of the invention as defined by the appended claims.

What is claimed is:

1. A method of determining the state of alignment between a semiconductor wafer and exposure equipment, the wafer having an alignment layer, and a photosensitive layer overlying the alignment layer, the photosensitive layer defining a plurality of exposure fields to be exposed by the exposure equipment, the alignment layer having a plurality of spaced apart surface features grouped together to serve as alignment marks dedicated to the exposure fields, each alignment mark comprising at least a 2×2 array of rows and columns of the surface features, said method comprising the steps of:

a) irradiating at least one of the alignment marks dedicated to an exposure field with light beams having a band of wavelengths preselected to prevent interference between light beams reflecting from the photosensitive layer and light beams reflecting from the surface features of the wafer, and to prevent the photosensitive layer from being photo-sensitized;

b) collecting the light beams reflected from the alignment mark and producing from the collected light an analog Y-axis photoelectric waveform signal characterizing the rows of surface features of the alignment mark and an analog X-axis photoelectric waveform signal characterizing the columns of surface features of the alignment mark;

c) digitizing the analog photoelectric waveform signals, calculating a deviation $\Delta x$ between the center of the digitized X-axis photoelectric waveform signal and a digital signal representing an X-axis reference mark center, and calculating a deviation $\Delta y$ between the center of the digitized Y-axis photoelectric waveform signal and a digital signal representing a Y-axis reference mark center;

d) repeating steps a) through c) with respect to any other alignment mark dedicated to the exposure field;

e) repeating steps a) through d) for each of the other exposure fields; and f) determining the degree to which the wafer is misaligned with respect to the exposure equipment based on the deviations $\Delta x$ and $\Delta y$ calculated upon performing steps c) through e).

2. The method of claim 1, wherein step c) comprises irradiating a reticle having a row of X-axis index marks and a column of Y-axis index marks to form an image of the index marks, producing an analog photoelectric signal representative of the image of the index marks, digitizing the analog photoelectric signal representative of the image of the index marks to produce digital signals representative of the row and column of index marks, respectively, calculating the center of the digital signal representative of the row of X-axis index marks to produce said digital signal representing an X-axis reference mark center, and calculating the center of the digital signal representative of the column of Y-axis index marks to produce said digital signal representing a Y-axis reference mark center.

* * * * *